United States Patent
Kato et al.

(10) Patent No.: US 7,061,309 B2
(45) Date of Patent: Jun. 13, 2006

(54) TRANSCONDUCTANCE-ADJUSTING CIRCUIT

(75) Inventors: Hidetaka Kato, Kanagawa (JP); Yasumasa Hasegawa, Kanagawa (JP); Masahiro Segami, Kanagawa (JP)

(73) Assignee: Sony Corporation, Tokyo (JP)

( * ) Notice: Subject to any disclaimer, the term of this patent is extended or adjusted under 35 U.S.C. 154(b) by 4 days.

(21) Appl. No.: 10/938,288

(22) Filed: Sep. 10, 2004

(65) Prior Publication Data

US 2005/0062524 A1    Mar. 24, 2005

(30) Foreign Application Priority Data

Sep. 12, 2003    (JP) .............................. 2003-320885

(51) Int. Cl.
*H03K 5/00*    (2006.01)

(52) U.S. Cl. ..................................................... 327/553

(58) Field of Classification Search ......... 327/552–559
See application file for complete search history.

(56) References Cited

U.S. PATENT DOCUMENTS

| | | | | |
|---|---|---|---|---|
| 6,326,838 B1 * | 12/2001 | Kimura et al. | ............... | 327/552 |
| 6,538,498 B1 * | 3/2003 | Lee et al. | ..................... | 327/553 |
| 6,838,929 B1 * | 1/2005 | Mitteregger | ................ | 327/553 |
| 6,930,565 B1 * | 8/2005 | Vishinsky | .................. | 333/17.1 |

* cited by examiner

*Primary Examiner*—Dinh T. Le
(74) *Attorney, Agent, or Firm*—Robert J. Depke; Trexler, Bushnell, Giangiorgi, Blackstone & Marr, Ltd.

(57) ABSTRACT

A transconductance-adjusting circuit includes a first VI converting circuit for converting a first reference voltage which is input to a current; a resistor for producing a voltage from the current output from the first VI converting circuit; a second VI converting circuit for outputting a current corresponding to a potential difference between the voltage produced by the resistor and a second reference voltage; an IV converting circuit for converting the current output from the second VI converting circuit to a voltage; and a feedback unit for changing operating points of an input circuit for inputting the first reference voltage of the first VI converting circuit by the voltage output from the IV converting circuit so that the potential difference is 0. The voltage output from the IV converting circuit is provided to a bias source for an input differential pair in a primary RC filter.

6 Claims, 8 Drawing Sheets

TRANSCONDUCTANCE-ADJUSTING CIRCUIT

The present application claims priority to Japanese Patent Application JP2003-320885, filed in the Japanese Patent Office Sep. 12, 2003; the entire contents of which is incorporated herein by reference.

BACKGROUND OF THE INVENTION

1. Field of the Invention

The present invention relates to a transconductance-adjusting circuit for controlling frequency characteristics of a primary resistor-capacitor (RC) filter.

2. Description of the Related Art

In known optical disk units, waveforms of analog signals output from optical pickups are adjusted by equalizing with high-pass filters and low-pass filters, and the analog signals are then converted to digital signals. This process uses a known circuit, for example, shown in FIG. 5 as a filter.

Referring to FIG. 5, a primary RC filter 50 which is also referred to as merely a filter hereinafter includes an input differential pair composed of N-channel transistors N1 and N2, and a bias source composed of N-channel transistors N3 and N4. The source terminals of the transistors N1 and N2 connect to a capacitor C1 and function as differential outputs. Thus, a primary low-pass RC filter has impedance, i.e., the inverse number of transconductance gm, of the source terminals and the capacitance of the capacitor C1.

N-channel transistors N5 and N6 having the same channel width and length which are referred to as W/L hereinafter as the transistors N1 and N2 are connected to the drain terminals of the transistors N1 and N2 as loads, respectively. In each of the transistors N5 and N6, the gate shorts to the drain terminal. The loads, i.e., the drain terminals of the transistors N1 and N2 function as differential outputs. Thus, a primary high-pass RC filter is formed.

In the filter 50 having such a structure, when drain currents in the transistors N3 and N4 are unstable, the transconductance gm is also unstable. Thus, the impedances of the source terminals of the transistors N1 and N2 are unstable, and frequency characteristics of the filter 50 are also unstable. Accordingly, it is significantly important to stabilize the drain currents in the transistors N3 and N4. Cut-off frequencies in the filter 50 can be changed by changing the transconductance gm through control of the drain currents in the transistors N3 and N4.

As described above, the filter 50 can be used as both the high-pass filter and the low-pass filter, and can change the cut-off frequencies through control of the drain currents in the transistors N3 and N4. When playback speed is changed, frequency characteristics of a waveform shaping circuit must be changed according to the playback speed. This control can be achieved by changing the drain currents in the transistors N3 and N4. Thus, the filter 50 is suitable for use in the waveform shaping circuit which adjusts shapes of analog signals output from optical pickups.

In the filter 50 shown in FIG. 5, it is very important to retain the transconductance gm at a preset value. The transistors N3 and N4 need to provide a bias to retain the transconductance gm. Thus, the filter 50 is used in combination with the transconductance-adjusting circuit which is referred to as a gm-adjusting circuit. FIG. 6 is a circuit diagram illustrating this case.

Referring to FIG. 6, a gm-adjusting circuit 60 includes P-channel transistors P1 to P4, N-channel transistors N7, N9, and N10, an N-channel transistor group N8, and source resistors R1 of the transistor group N8. Individual transistors having the same W/L in the transistor group N8 are connected to each other in parallel. A pair of the transistor N7 and the transistor group N8, and a pair of the transistors P1 and P2 respectively form current mirrors.

The transistor N9 having the same W/L as the transistor N7 is cascade-connected to the drain of the transistor N7, and the transistor N10 having the same W/L as the transistor group N8 is cascade-connected to the drain of the transistor group N8. Thus, the transistor N7 and the transistor group N8 have the same drain electric potential. Similarly, the transistor P3 having the same W/L as the transistor P1 is cascade-connected to the source of the transistor P1, and the transistor P4 having the same W/L as the transistor P2 is cascade-connected to the source of the transistor P2. Thus, the transistors P1 and P2 have the same drain electric potential.

The transistors N7, P1, P2, and each transistor of the transistor group N8 have the same W/L. The transistor group NB including multiple transistors connected to each other in parallel have K times W/L of one transistor.

Assuming the drain currents in the transistors N10 and P4 are Iout, the same current Iout runs through the drain terminals of the transistors N9 and P3 by the current mirror effect of the transistors P1 and P2 and the current mirror effect of the transistors P3 and P4. The current Iout is represented by equation (1).

$$Iout = \frac{2}{\mu_n Cox(W/L)} \cdot \frac{1}{R_1^2}\left(1 - \frac{1}{\sqrt{K}}\right)^2 \quad (1)$$

where $\mu_n$ is the mobility of an N-channel transistor and $C_{ox}$ is the gate capacitance per unit area. The transconductance gm1 in the transistor N7 is represented by equation (2).

$$gm1 = \sqrt{2\mu_n Cox\left(\frac{W}{L}\right)Iout} \quad (2)$$

Equation (3) is obtained by substituting the right-hand side of equation (1) for Iout in equation (2).

$$gm1 = \frac{2}{R_1}\left(1 - \frac{1}{\sqrt{K}}\right) \quad (3)$$

Equation (3) shows that the transconductance gm1 of the transistor N7 has no relationship with a supply voltage VDD and is insensitive to a change in the supply voltage. Equation (3) also shows that the transconductance gm1 is insensitive to circuit temperature when the resistor R1 is disposed at the outside of the circuit.

When the gate terminal of the transistor N7 having the transconductance gm1 given by equation (3) in the gm-adjusting circuit 60 of the filter 50 shown in FIG. 6 is connected to the gate terminals of the transistors N3 and N4 which are the bias source of the filter 50 and when the transistor N7 has the same W/L as the transistors N3 and N4, the transistors N3 and N4 have the same transconductance gm1. That is, the transistors N3, N4, and N7 are in a current mirror relationship, and thus the output currents, i.e., drain currents in the transistors N3 and N4 are the same as the current Iout given by equation (1).

When the transistor N7 has the same W/L as the transistors N1 and N2, the source terminals of which have the impedance, i.e., 1/gm and function as the output terminals of the low-pass filter of the filter 50 and the transistors N5 and N6 which function as the output terminals of the high-pass filter, the transistors N1, N2, N5, and N6 have the same transconductance gm1 given by equation (3). Thus, each source terminal has a constant impedance, and stable frequency characteristics insensitive to a change in the supply voltage and the atmospheric temperature are achieved.

In many applications of the primary RC filter 50, the frequency characteristics are always controlled. Thus, functions which can control the frequency characteristics of the filter 50 are required. In the circuit shown in FIG. 6, arrangements which realize such functions may be as follows: (a) In equation (3), the resistance R1 and the number K of transistors connected to each other in parallel in the transistor group N8 may be variable. (b) In the filter 50, a plurality of transistors may be arranged in parallel, instead of each transistor.

In the case that the resistance R1 is variable, the resistor R1 is generally disposed at the outside of the circuit and must have an additional function to change the resistance R1, so that controlling functions and components on a board increase. Thus, in consideration with production costs of the board, the resistance R1 is preferably a fixed value. Referring to FIG. 7, the case that the number K of transistors connected to each other in parallel in the transistor group 8 is changed will now be described.

In FIG. 7, the frequencies are generally changed by logic commands, and the number of bits required for control is determined according to the variable range of the frequencies and the number of phases in this range. In this arrangement, the transistor group N8 including K transistors 7 is needed to be connected through switches SW to a transistor group N11 including K transistors 7, a transistor group N12 including 2K transistors 7, a transistor group N13 including 4K transistors 7, etc. as shown in FIG. 7. Consequently, 64K transistors 7 are connected to each other in parallel to enable 6-bit control. Required cut-off frequencies can be set by changing the bias currents in the transistors N3 and N4 of the filter 50, the bias currents being changed by turning on/off the switches SW and changing the W/L of the transistor groups N8, and N11 to N16.

FIG. 8 is a circuit diagram illustrating another instance of known gm-adjusting circuits. This gm-adjusting circuit provides a constant transconductance gm. As is disclosed in pages 4 to 5 and FIG. 10 of Japanese Unexamined Patent Application Publication No. 2001-308683, a gm-adjusting circuit 62 of this instance includes a voltage-to-current (VI) converting amplifier 622, which is also referred to as a gm amplifier, having a variable transconductance gm, a general VI converting amplifier 624, a capacitor Cext and a resistor Rext which are connected to nodes connecting the VI converting amplifier 622 to the VI converting amplifier 624. An output Icnt of the VI converting amplifier 624 is fed back to the VI converting amplifier 622 having a variable transconductance gm.

When a direct-current (DC) voltage Va1 is applied between inputs of the VI converting amplifier 622, the VI converting amplifier 622 outputs a current gm0·Va1. The output current gm0·Va1 is converted to a voltage through the resistor Rext. The voltage gm0·Va1·Rext and a DC voltage Va2 are input to the VI converting amplifier 624, and a current Icnt corresponding to a potential difference between these two voltages is output. The current Icnt is then fed back to the VI converting amplifier 622, and the transconductance gm0 is changed so that gm0·Va1·Rext equals Va2. The transconductance gm0 of the gm amplifier is represented by equation (4).

$$gm_0 = \frac{1}{Rext} \times \frac{V_{a2}}{V_{a1}} \qquad (4)$$

When Va1 has the same voltage dependency as Va2, the ratio of Va2 to Va1 is constant, insensitive to a change in supply voltage. A constant transconductance gm0 is thereby achieved. Thus, when the filter 50 is provided with such a transconductance gm0, stable frequency characteristics are achieved. According to equation (4), cut-off frequencies are controlled by changing the voltage Va1 or the voltage Va2.

In the known gm-adjusting circuit 60 shown in FIG. 6, the number of the transistor 7 increases. This causes the following disadvantages: the area occupied by chips is increased; and the required transconductance gm is not achieved and precision in changing the frequencies is lowered due to the increased relative offset between the transistors.

The gm-adjusting circuit 62 shown in FIG. 8 changes the cut-off frequencies only by changing the voltage value while the gm-adjusting circuit 60 changes the cut-off frequencies by changing the number of transistors. Thus, a disadvantage caused by the increased number of transistors is avoided, and an advantage is achieved in that the variable range can be expanded by two parameters in a reasonable way.

When the frequency characteristics of the filter 50 shown in FIG. 5 are controlled by the gm-adjusting circuit 62, the filter 50 can have stable frequency characteristics and can control the cut-off frequencies if the transconductance of the transistors N1 and N2 being the input differential pair in the filter 50 agrees with the transconductance of the VI converting amplifier 622. However, the transconductance of the transistors N3 and N4 which are the bias source for the transistors N1 and N2, respectively, is controlled by the voltage applied to the gates of these transistors. Thus, the current Icnt output from the gm-adjusting circuit 62 cannot be used for controlling the transconductance of the filter 50.

SUMMARY OF THE INVENTION

Accordingly, it is an object of the present invention to provide a transconductance-adjusting circuit for expanding an adjustable frequency range of a filter and controlling frequency characteristics of the filter precisely, the transconductance of the filter being adjusted, without an increase in the area occupied by chips.

A transconductance-adjusting circuit includes a first VI converting circuit for converting a first reference voltage which is input to a current; a resistor for producing a voltage from the current output from the first VI converting circuit; a second VI converting circuit for outputting a current corresponding to a potential difference between the voltage produced by the resistor and a second reference voltage; an IV converting circuit for converting the current output from the second VI converting circuit to a voltage; and a feedback unit for changing operating points of an input circuit for inputting the first reference voltage of the first VI converting circuit by the voltage output from the IV converting circuit so that the potential difference is 0. The voltage output from the IV converting circuit is provided to a bias source for an input differential pair in a primary RC filter.

In the transconductance-adjusting circuit, the first reference voltage is converted to a current by the first VI converting circuit. The resistor produces a voltage from the current output from the first VI converting circuit. The second VI converting circuit converts the potential difference between the voltage produced by the resistor and the second reference voltage to a current. The voltage corresponding to the current output from the second VI converting circuit is fed back to the input circuit for inputting the first reference voltage of the first VI converting circuit. The operating points of the input circuit are adjusted so that the potential difference is 0. In this process, the transconductance at the time of the potential difference being 0 in the first VI converting circuit is achieved, the transconductance being determined by the relationship between the current output from the second VI converting circuit and the voltage corresponding to this output current. The transconductance is a function of the first reference voltage, the second reference voltage, and the resistance of the resistor. The transconductance is retained at a constant value insensitive to a change in supply voltage and to the temperature in the transconductance-adjusting circuit. Since a stable voltage is provided to terminals of transistors forming the bias source for the input differential pair in the primary RC filter, the drain current in each of transistors being the input differential pair is constant. At that time, the transconductance of the primary RC filter is the same as the transconductance of the transconductance-adjusting circuit, or is K times, where K is an integer, the transconductance of the transconductance-adjusting circuit. Thus, the frequency characteristics of the primary RC filter are always constant, insensitive to a change in the supply voltage and to a change in the temperature in the circuit.

The transconductance controlled by the transconductance-adjusting circuit can be changed by changing at least one of the first reference voltage and the second reference voltage. Since two parameters are available for changing the transconductance, a broad range of the transconductance can be obtained. The transconductance gm is not changed by adjusting the number of transistors connected to each other in parallel. Accordingly, an increase in the circuit size can be suppressed. Since a reduced number of transistors is used, an increase in relative offset between the transistors is suppressed, and the transconductance achieved in the primary RC filter can be precisely controlled. Thus, the frequency characteristics of the primary RC filter can be controlled precisely.

The transconductance-adjusting circuit according to the present invention can expand the adjustable frequency range of the primary RC filter and can precisely control the frequency characteristics of the filter without an increase in the area occupied by chips in the transconductance-adjusting circuit.

DESCRIPTION OF THE PREFERRED EMBODIMENTS

A transconductance-adjusting circuit provides a voltage for a primary RC filter to expand a variable frequency range of the filter, the frequency range being adjusted by the transconductance-adjusting circuit, and to precisely set frequency characteristics of the filter, without an increase in the area occupied by chips in the transconductance-adjusting circuit.

First Embodiment

Figure 1:
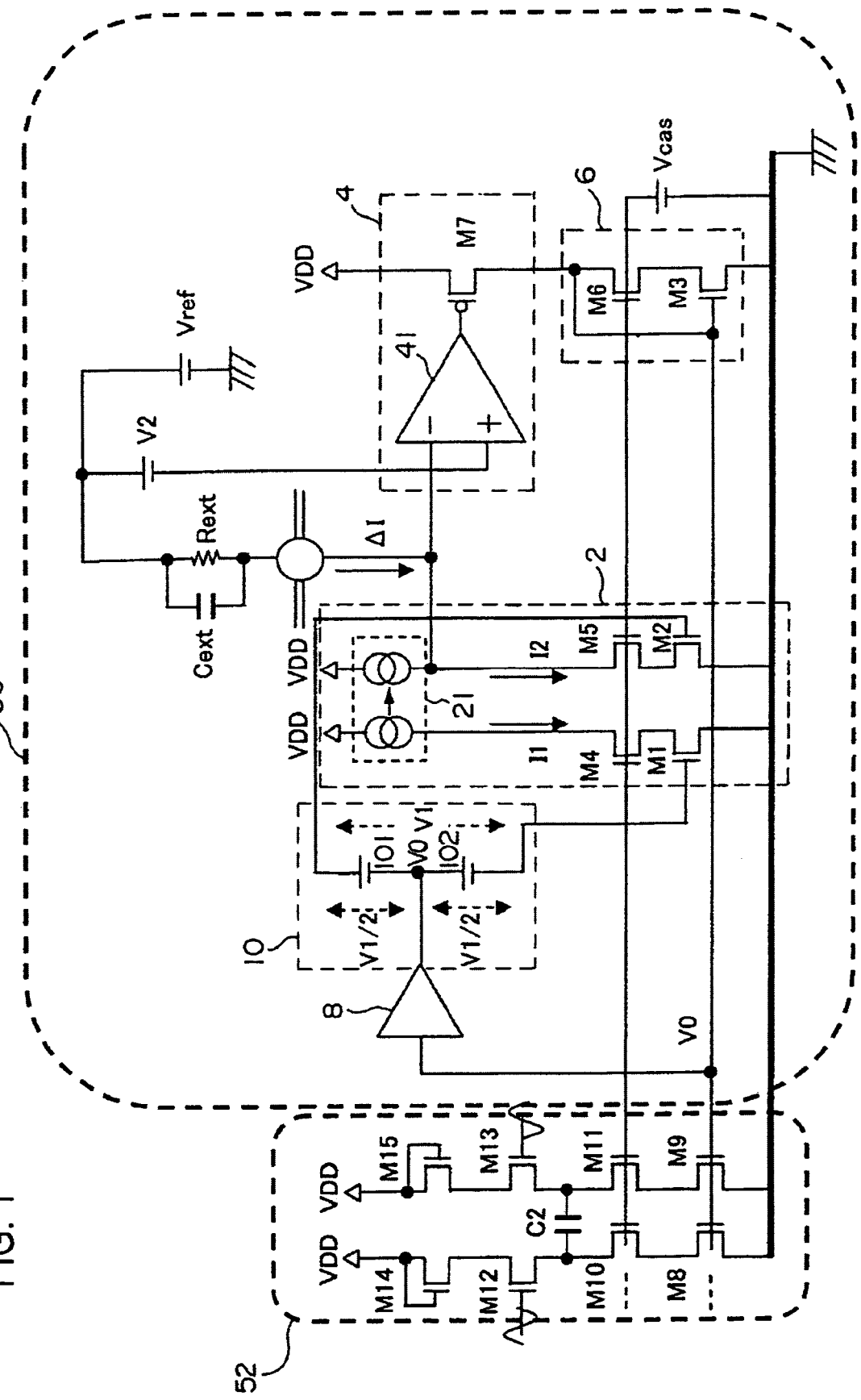
FIG. 1 is a circuit diagram illustrating the structure of a transconductance-adjusting circuit according to a first embodiment of the present invention.

FIG. 1 is a circuit diagram illustrating the structure of a transconductance-adjusting circuit, which is also referred to as a gm-adjusting circuit, according to a first embodiment of the present invention. In FIG. 1, the same reference numerals as used in the drawings of the known circuit are used for elements corresponding to those shown in the drawings of the known circuit.

A gm-adjusting circuit 80 of this embodiment includes a first VI converting circuit 2 which has a variable transconductance gm and converts a reference voltage V1 to a current, a second VI converting circuit 4 which converts a potential difference between a reference voltage V2 and a voltage produced by a resistor Rext to a current, a current-to-voltage (IV) converting circuit 6 which converts the output current from the second VI converting circuit 4 to a voltage, a buffer 8 which is a part of a feedback unit and changes an electric potential of an input differential pair in the first VI converting circuit 2, a voltage-generating circuit 10 which is another part of the feedback unit and generates the reference voltage V1, the resistor Rext which converts an output current ΔI from the first VI converting circuit 2 to a voltage, a capacitor Cext which stabilizes operations, a reference supply Vref which supplies an electric potential for producing the reference voltage V2, and a bias supply Vcas which supplies cascade-connected transistors with a bias voltage.

The first VI converting circuit 2 having a variable transconductance gm includes N-channel transistors M1 and M2 which function as an input circuit, i.e., the input differential pair; N-channel transistors M4 and M5 cascade-connected to the transistors M1 and M2, respectively; and a current mirror circuit 21. The second VI converting circuit 4 includes an operational amplifier 41 and a P-channel transistor M7. The IV converting circuit 6 includes an N-channel transistor M6 cascade-connected to an N-channel transistor M3 which functions as a voltage-output transistor. The voltage-generating circuit 10 includes a voltage source 101 producing a voltage (V0+V1/2) and a voltage source 102 producing a voltage (V0−V1/2), where V0 denotes a common-mode direct-current (DC) voltage.

The gm-adjusting circuit 80 is connected to a primary RC filter 52 which is also referred to as merely a filter. The filter 52 has the substantially same structure as a known filter. The filter 52 includes N-channel transistor groups M12 and M13 being an input differential pair; N-channel transistor groups M8 and M9 supplying a bias for the transistor groups M12 and M13; N-channel transistor groups M14 and M15, respectively, having the same W/L as the transistor groups M12 and M13, including the gates shorted to the drains and functioning as loads of the transistor groups M12 and M13; transistor groups M10 and M11 cascade-connected to the transistor groups M8 and M9, respectively, so that the transistor groups MB and M9 have the same drain electric potential; and a capacitor C2 disposed between the sources of the transistor groups M12 and M13.

In the above primary RC filter 52 as in a known filter, frequency characteristics are determined by the capacitance of the capacitor C2 and the impedance, i.e., 1/gm, of the source terminal of each of the transistor groups M12 and M13. The source terminals of the transistor groups M12 and M13 function as differential outputs. Thus, a low-pass RC filter is formed. The transistor groups M14 and M15 having the same W/L as the transistor groups M12 and M13 are connected to the drain terminals of the transistor groups M12 and M13 as loads, respectively. The source terminals of the transistor groups M14 and M15 function as differential outputs. Thus, a high-pass RC filter is formed.

A bias voltage for the gates of the cascade-connected transistor groups M10 and M11 in the primary RC filter 52, and the cascade-connected transistors M4, M5, and M6 in the gm-adjusting circuit 80 is provided by a common bias supply Vcas. Thus, the transistors M1, M2, and M3 and the transistor groups M8 and M9 have the same drain voltage.

An operation of the first embodiment will now be described. The transistors M1 and M2 in the first VI converting circuit 2 are a source-grounded differential pair. The voltage-generating circuit 10 applies the reference voltage V1 to the gate input terminals of the transistors M1 and M2 by outputting a voltage (V0+V1/2) to the gate input terminal of the transistors M2 and outputting a voltage (V0−V1/2) to the gate input terminal of the transistors M1, the common-mode DC voltage V0 being provided by the buffer 8.

When the reference voltage V1 is applied between the input terminals of the transistors M1 and M2, a drain current I1 runs through the transistors M1 and M4, and a drain current I2 runs through the transistors M5 and M2. In this case, the drain current I1 output from the transistor M1 having a low electric potential is mirrored to the drain terminal of the transistor M5, which is the output of the transistor M2 having a high electric potential, through the current mirror circuit 21 including P-channel transistors. In this way, the output current ΔI, i.e., (I2−I1) is produced, and the transconductance gm2 of the transistors M1 and M2 is determined.

The output current from the first VI converting circuit 2 runs through a load composed of the resistor Rext disposed at the outside of the integrated circuit in parallel with the capacitance Cext, and a voltage Rext·ΔI is produced by the resistor Rext. Then, the voltage Rext·ΔI is input to an inverting input terminal of the second VI converting circuit 4, and the reference voltage V2 is input to a non-inverting input terminal of the second VI converting circuit 4. The second VI converting circuit 4 outputs a voltage corresponding to the potential difference between the voltage produced by the resistor Rext and the reference voltage V2 to the gate of the transistor M7. Thus, a drain current corresponding to the potential difference between the voltage produced by the resistor Rext and the reference voltage V2 runs through the transistors M6 and M3.

The voltage V0 corresponding to the potential difference between the voltage produced by the resistor Rext and the reference voltage V2 is produced at the gate of the transistor M3 connected to the drain of the transistor M6. The voltage V0 is fed back to the first VI converting circuit 2 through the buffer 8 and the voltage-generating circuit 10. Accordingly, the voltage V0 of the voltage-generating circuit 10 is changed according to the potential difference, and operating points of the transistors M1 and M2 being the source-grounded differential pair in the first VI converting circuit 2 are changed. Thus, the output current ΔI of the first VI converting circuit 2 is changed.

These changes are effected so that the potential difference between the voltage produced by the resistor Rext and the reference voltage V2 is 0. That is, the voltage produced by the resistor Rext is equal to the reference voltage V2 through the above-described feedback unit. In such a condition, the gate voltage of the transistor M3 is supplied to the gates of the transistor groups M8 and M9 forming the bias source in the primary RC filter 52. Thus, the transistors M3 and the transistor groups M8 and M9 have the same transconductance gm2. Regarding the phase margin in the feedback loop, a first pole is determined by the resistance Rext and the capacitance Cext. A sufficient phase margin can be ensured by setting a large Cext. Thus, the problem of, for example, oscillation can be avoided.

Equations which determine the transconductance in the gm-adjusting circuit 80 will now be described.

Referring to FIG. 1, when a voltage (V0−V1/2) is applied to the gate terminal of the transistors M1 and a voltage (V0+V1/2) is applied to the gate terminal of the transistors M2, the output current I1 and the output current I2 are given by equation (5).

$$I_1 = \frac{\beta n}{2}\left(V_0 - \frac{V_1}{2} - Vth\right)^2 \quad I_2 = \frac{\beta n}{2}\left(V_0 + \frac{V_1}{2} - Vth\right)^2 \quad (5)$$

where Vth is the threshold voltage of N-channel transistors and $\beta n = \mu n \times Cox \times (W/L)$ where $\mu n$ is the mobility and Cox is the gate capacitance. The output current ΔI corresponding to the difference between the output current from the transistor M1 and the output current from the transistor M2 is given by equation (6).

$$\Delta I = I_2 - I_1 = \frac{\beta n}{2}\left[(V_0 - Vth)^2 + 2(V_0 - Vth)\cdot\frac{V_1}{2} + \left(\frac{V_1}{2}\right)^2\right] - \frac{\beta n}{2}\left[(V_0 - Vth)^2 - 2(V_0 - Vth)\cdot\frac{V_1}{2} + \left(\frac{V_1}{2}\right)^2\right] = \beta n(V_0 - Vth)\cdot V_1 \quad (6)$$

In general, a gate-source voltage is represented by Vgs. Thus, the above equation is modified to equation (7).

$$\Delta I = gm_2 \cdot V_1 \quad (7)$$

The transconductance gm2 is the transconductance of the transistor M3 when the gate-source voltage Vgs is the voltage V0. In combination with equation (8), the transconductance gm2 is represented by equation (9).

$$V_2 = Rext \times \Delta I = Rext \times gm_2 \cdot V_1 \quad (8)$$

$$gm_2 = \frac{1}{Rext} \times \frac{V_2}{V_1} \quad (9)$$

Equation (9) is similar to equation (4). When the voltage V1 and the voltage V2 have the same dependency on the supply voltage VDD, the ratio V2/V1 is invariable. The resistor Rext is disposed at the outside of the circuit. Thus, the transconductance gm2 of the transistor M3 is insensitive to a change in the supply voltage and a change in the circuit temperature.

When the transistor groups M8, M9, and M12 to M15 in the primary RC filter 52 have the same W/L as the transistor M3 in the gm-adjusting circuit 80, the transconductance of these transistor groups is also given by equation (9). Thus, the primary RC filter 52 has stable frequency characteristics insensitive to a change in the supply voltage and a change in the circuit temperature. In FIG. 1, the transistors M4, M5, and M6 and the transistor groups M10 and M11 are cascade-connected transistors. Thus, the transistors M1, M2, and M3 and the transistor groups M8 and M9 have the same drain terminal voltage, so that the relative variation among the output currents of the transistors M1, M2, and M3 and the transistor groups M8 and M9 is suppressed.

The transistor M3 in the gm-adjusting circuit 80 and the transistor groups M8 and M9 in the primary RC filter 52 are in a current mirror relationship. Accordingly, the same current as the current which runs through the transistor M3 runs through the transistor groups M8 and M9. Thus, the transistor M3 and the transistor groups M8 and M9 have the same transconductance gm2, the transistor groups M8 and M9 forming the bias source in the primary RC filter 52.

The frequency characteristics of the primary RC filter 52 can be adjusted by controlling the transconductance determined by the gm-adjusting circuit 80. Techniques for controlling the transconductance will now be described. Equation (9) shows that the transconductance gm2 determined by the gate voltage of the transistor M3 is a function of the resistance Rext, the reference voltage V1, and the reference voltage V2. Thus, the transconductance of the primary RC filter 52 can be adjusted by (1) changing V1, (2) changing V2, and/or (3) changing Rext. Alternatively, the transconductance can be adjusted to be K times the transconductance of the above-described basic configuration of the filter 52 by (4) expanding the configuration of the filter 52 so that the number of transistors in each of the transistor groups M8 to M15 in the filter 52 is K times the number of the transistor M3, the transistors in each transistor group having the same W/L as the transistor M3 and being connected to each other in parallel.

Figure 2:
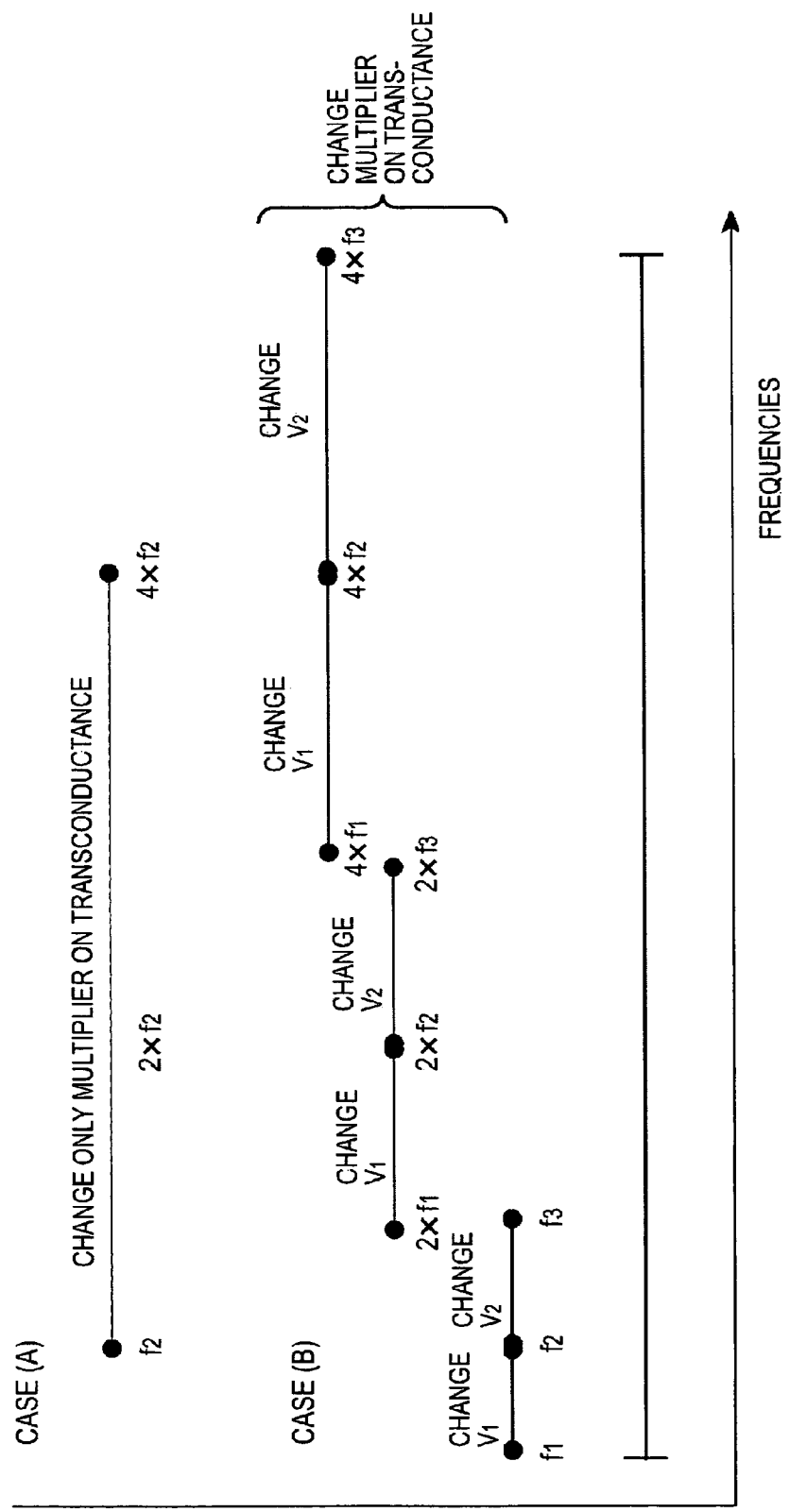
FIG. 2 illustrates adjustable frequency ranges of a filter used in combination with the transconductance-adjusting circuit shown in FIG. 1.

A broad adjustable frequency range of the filter can be achieved by at least one of the techniques (1) to (4). Referring to FIG. 2, it will be now described that the broad adjustable frequency range of the filter is achieved by adjusting cut-off frequencies of the filter 52 by changing the reference voltage V1, the reference voltage V2, and the number of transistors in each transistor group composing the filter circuit. In FIG. 2, the cut-off frequencies are shown by f1, f2, and f3 where f1<f2<f3. Case (A) shows that the adjustable frequency range is controlled only by the technique (4) in a known filter. Case (B) shows that the adjustable frequency range is adjusted by the techniques (1), (2), and (4) in the filter according to the present invention.

In case (B), the range between the cut-off frequencies f1 and f2 is adjusted by changing the reference voltage V1, and the range between the cut-off frequencies f2 and f3 is adjusted by changing the reference voltage V2. In addition, the multiplier K, where K=1, 2, or 4, on the transconductance of the filter 52 is increased by increasing the number of transistors in each transistor group which are turned on in the filter 52 to adjust the cut-off frequencies. Thus, when these adjustments are used in combination, the total adjustable range of cut-off frequencies covers f1 to 4×f3, more specifically f1 to f3, 2×f1 to 2×f3, and 4×f1 to 4×f3. In contrast, in case (A), the range of the cut-off frequencies is adjusted only by changing the multiplier K. Thus, the adjustable range of the cut-off frequencies covers f1 to 4×f1, f2 to 4×f2, or f3 to 4×f3, each of which is narrower than the adjustable range achieved in case (B) of the present invention.

In the first embodiment of the present invention, the transconductance gm2 is determined by the gm-adjusting circuit 80, and the primary RC filter 52 has the same transconductance gm2. The transconductance gm2 is insensitive to a change in the supply voltage and a change in the circuit temperature. Thus, the frequency characteristics of the filter 52 are stable.

The transconductance achieved in the filter 52 can be changed by the reference voltage V1 and the reference voltage V2. Thus, a broad adjustable frequency range of the filter 52 can be achieved without an increase in the area occupied by chips.

Moreover, the number of the transistors is relatively small. Accordingly, the relative offset between the transistors is reduced by disposing the transistors close to each other, and the deviation in the transconductance gm2 is small. Thus, the frequencies of the filter 52 can be set precisely.

In the first embodiment, the transistors M4, M5, and M6 and the transistor groups M10 and M11 are cascade-connected to the circuits so that the transistors M1, M2, and M3 and the transistor groups M8 and M9 have the same drain terminal voltage. Thus, the relative variation among the output currents of the transistors M1, M2, and M3 and the transistor groups M8 and M9 is suppressed, and the transconductance gm2 is precisely controlled.

In addition, the multiplier K, where K=1, 2, or 4, on the transconductance of the filter 52 is increased by increasing the number of transistors in each transistor group which are turned on in the filter 52, so that the adjustable frequency range of the filter 52 can be expanded. Accordingly, when waveforms of analog signals output from optical pickups are adjusted, the filter 52 can respond to a large change in playback speed.

In the first embodiment, the gm-adjusting circuit 80 includes the transistor M6 cascade-connected to the transistor M3, the gate of the transistor M3 being connected to the drain of the transistor M6, so that a sufficient dynamic range can be achieved in the gm-adjusting circuit 80 even when the supply voltage VDD is low, for example, 3 V. When the supply voltage VDD is high, for example, 12 V, the gate of the transistor M3 may be shorted to the drain of the transistor M3.

Second Embodiment

Figure 3:
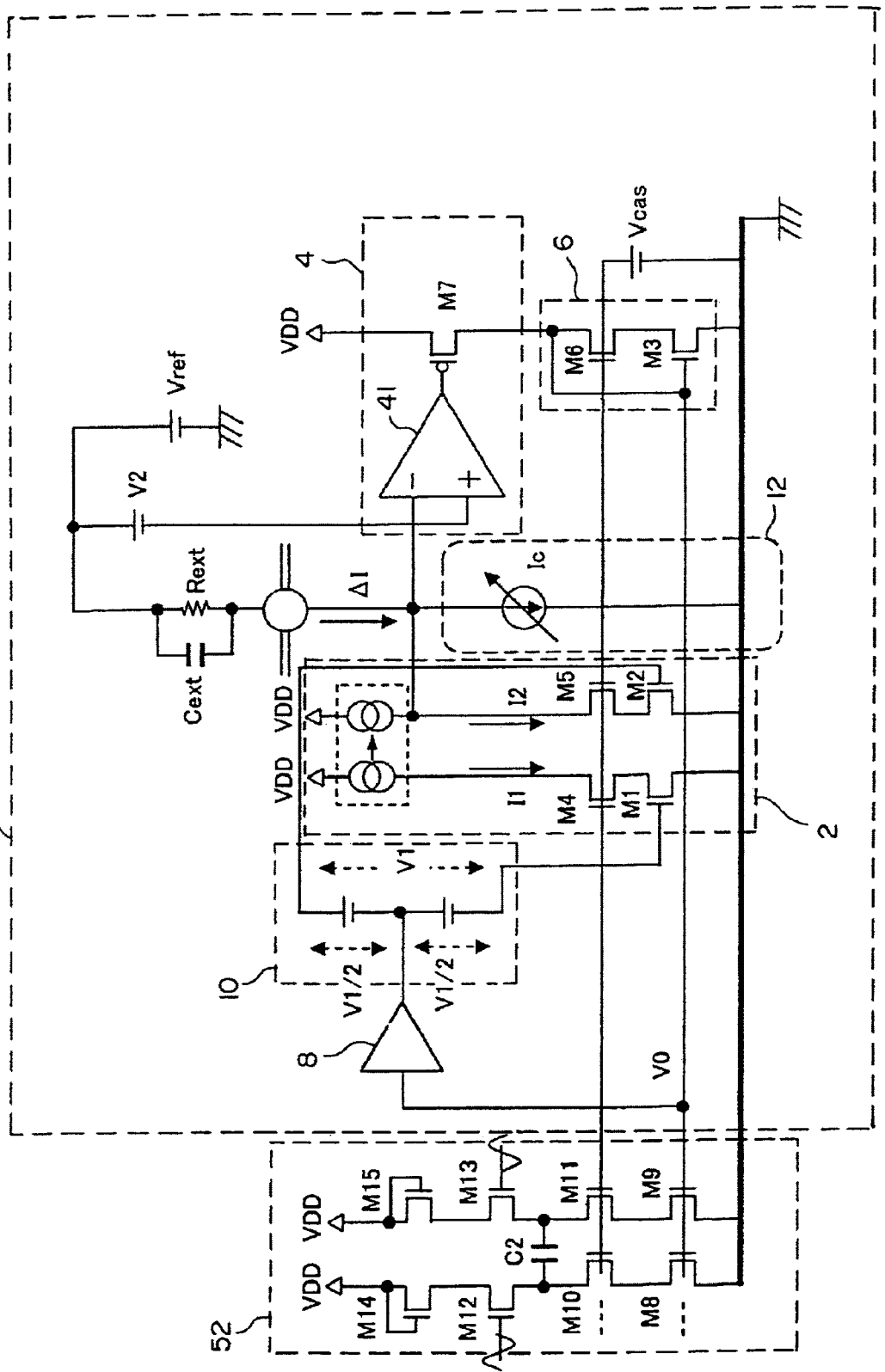
FIG. 3 is a circuit diagram illustrating the structure of a transconductance-adjusting circuit according to a second embodiment of the present invention.

FIG. 3 is a circuit diagram illustrating the structure of a transconductance-adjusting circuit, which is also referred to as a gm-adjusting circuit, according to a second embodiment of the present invention. In FIG. 3, the same reference numerals as used in FIG. 1 of the first embodiment are used for elements corresponding to those shown in FIG. 1.

A gm-adjusting circuit 82 of this embodiment includes the same elements as in the first embodiment, and additionally includes a variable current source 12 for adding a current Ic to an output current ΔI generated by difference between electric potentials of transistors M1 and M2 being an input differential pair, the variable current source 12 being connected to a node connecting a first VI converting circuit 2 to a second VI converting circuit 4.

An operation of the second embodiment will now be described. In the second embodiment, the current Ic is added to the output current ΔI from the first VI converting circuit 2. Thus, the transconductance gm2 of a transistor M3 can be changed by changing the current Ic.

The transconductance gm2 in the second embodiment is obtained by equation (10) derived from equation (7) and equation (8) as in the first embodiment, ΔI in the equation (8) being replaced with (ΔI+Ic).

$$V_2 = Rext \times (\Delta I + Ic) = Rext \times gm_2 \cdot V_1 + Rext \times Ic \qquad (10)$$

The transconductance gm2 is given by equation (11) derived from equation (10).

$$gm_2 = \frac{1}{Rext} \times \frac{1}{V_1}(V_2 - Rext \times Ic) = \frac{1}{Rext} \times \frac{V_2}{V_1} - \frac{Ic}{V_1} \qquad (11)$$

Assuming that the parameters V1, V2, and Ic are insensitive to a change in supply voltage and a change in circuit temperature, equation (11) shows that the transconductance gm2 is adjusted by changing the parameter IC.

In the second embodiment, the advantages in the first embodiment can be also achieved. In addition to the advantages in the first embodiment, the transconductance can be changed by changing the current Ic of the variable current source 12 in addition to the voltage V1 and the voltage V2. Thus, an adjustable frequency range of a filter 52 is broader than that in the first embodiment and the filter 52 is easily adjusted.

In the second embodiment, if a supply voltage VDD is not low, the gm-adjusting circuit 82 has a sufficient dynamic range and operates normally even when the gate of the transistor M3 is shorted to the drain of the transistor M3.

Third Embodiment

Figure 4:
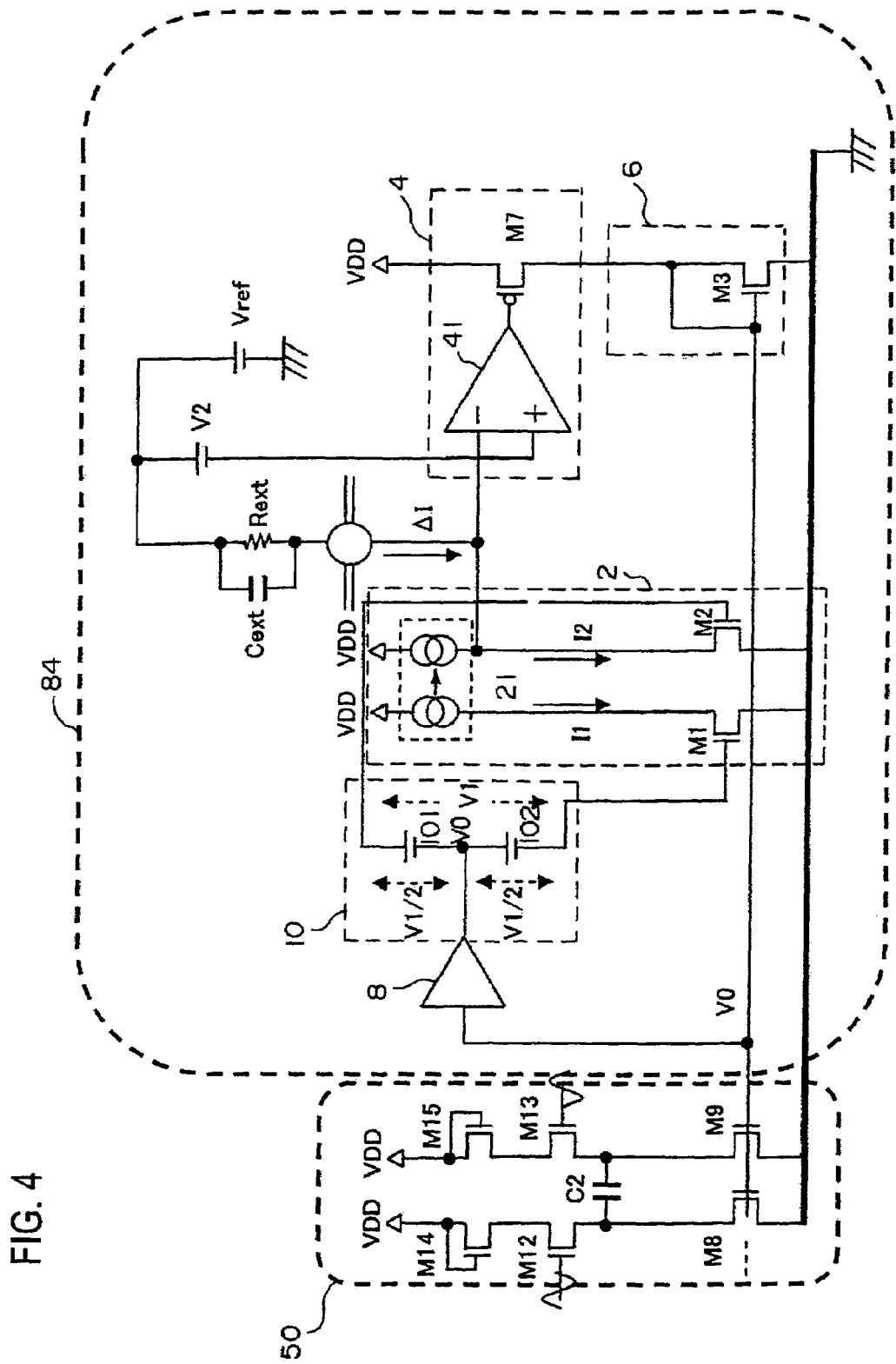
FIG. 4 is a circuit diagram illustrating the structure of a transconductance-adjusting circuit according to a third embodiment of the present invention.
Figure 5:
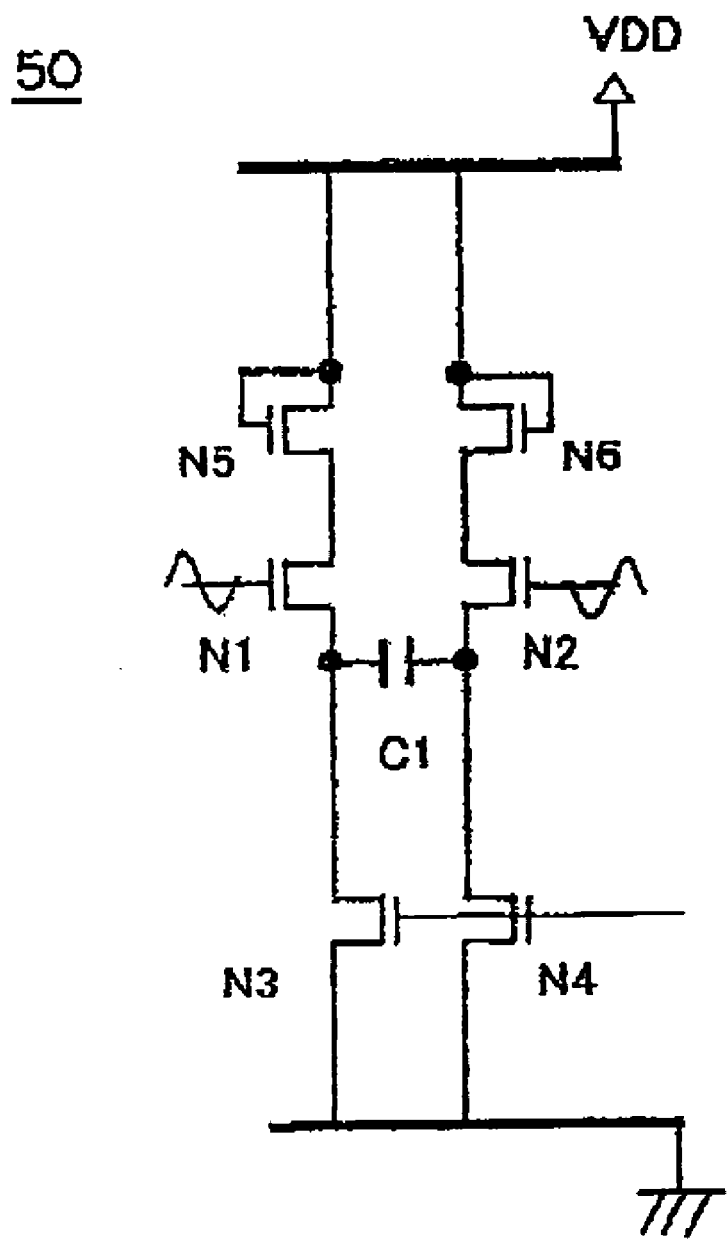
FIG. 5 is a circuit diagram illustrating the structure of a known primary RC filter.
Figure 6:
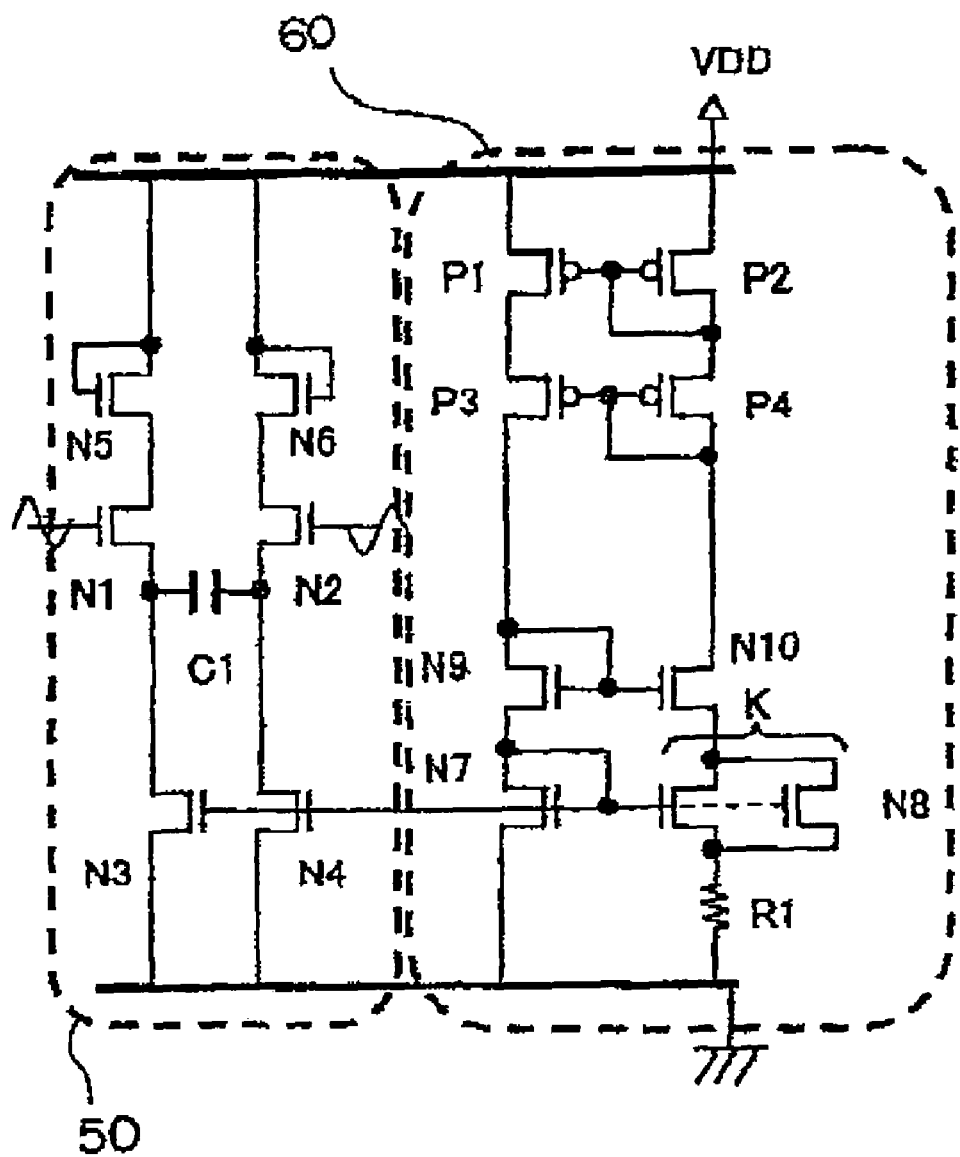
FIG. 6 is a circuit diagram illustrating a known transconductance-adjusting circuit.
Figure 7:
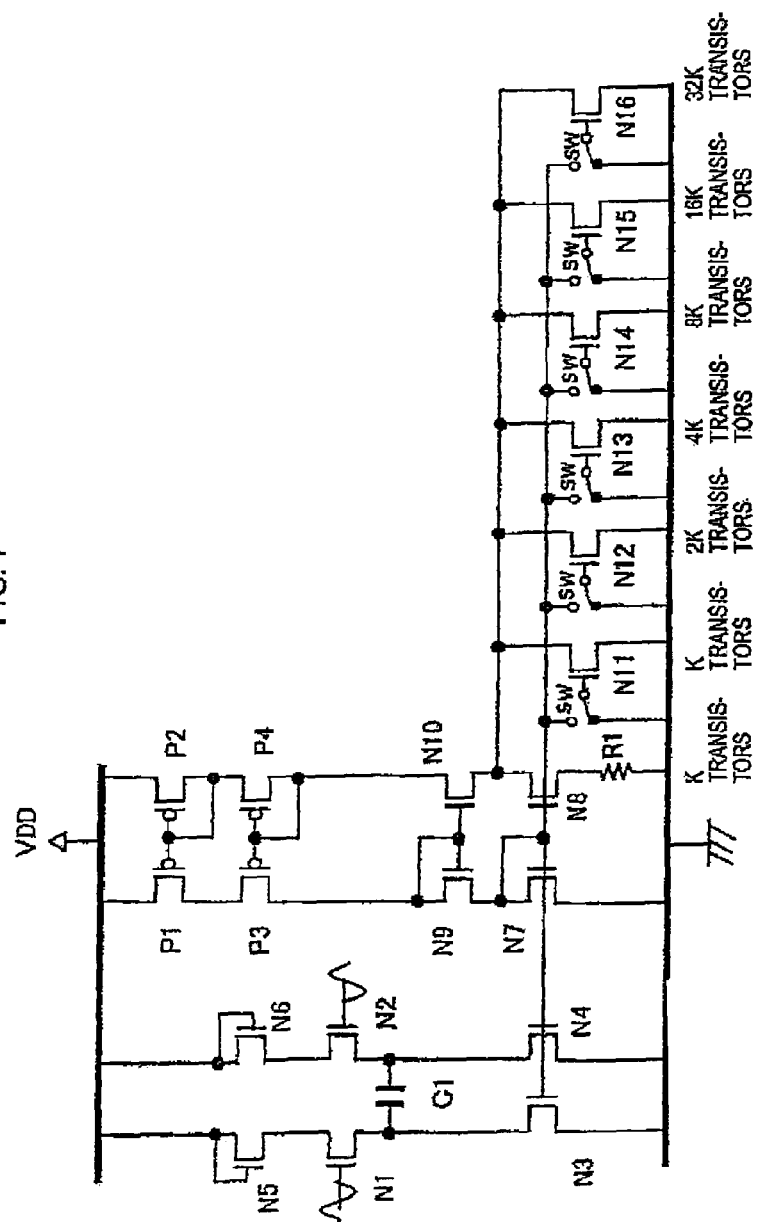
FIG. 7 is a circuit diagram illustrating another known transconductance-adjusting circuit.
Figure 8:
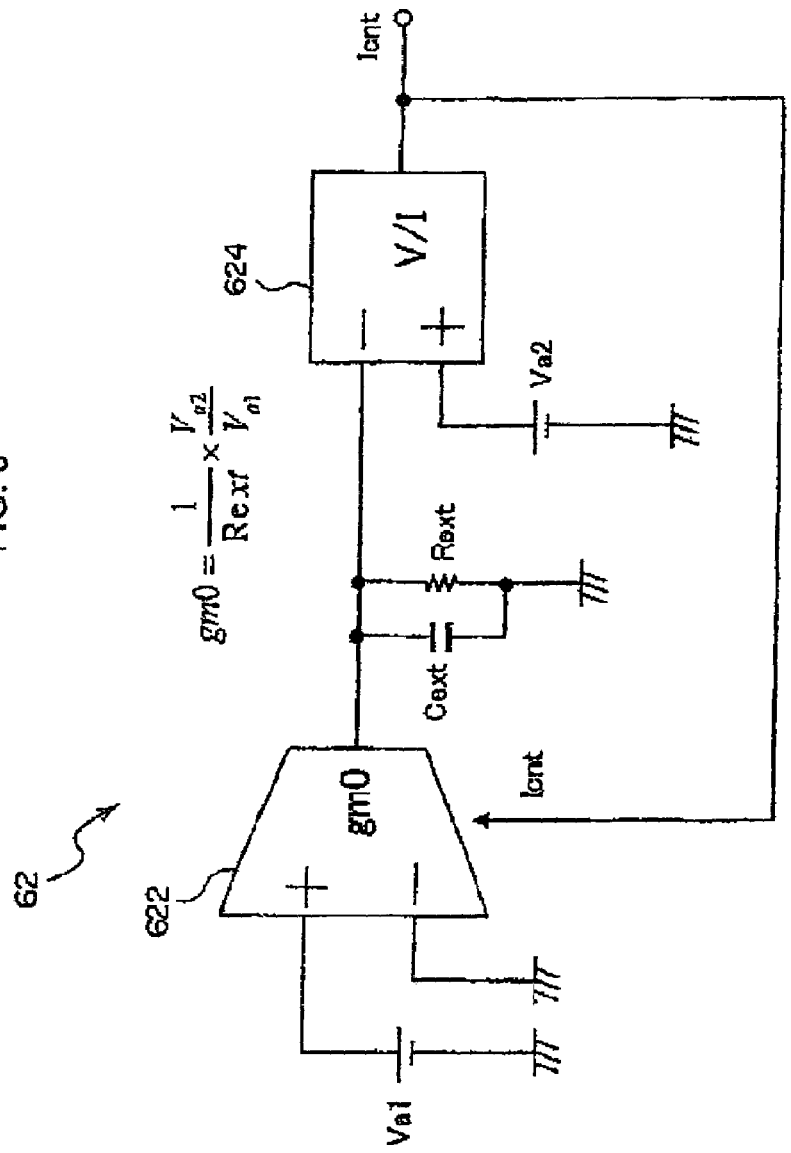
FIG. 8 is a circuit diagram illustrating another known transconductance-adjusting circuit.

FIG. 4 is a circuit diagram illustrating the structure of a transconductance-adjusting circuit, which is also referred to as a gm-adjusting circuit, according to a third embodiment of the present invention. In FIG. 4, the same reference numerals as used in FIG. 1 of the first embodiment are used for elements corresponding to those shown in FIG. 1.

A gm-adjusting circuit 84 and a primary RC filter 50 in the third embodiment have the same elements as the gm-adjusting circuit 80 and the primary RC filter 52 in the first embodiment, except the transistors M4, M5, and M6 and the transistor groups M10 and M11 cascade-connected to the circuits in the first embodiment are not included.

In the third embodiment, the transistors M4, M5, and M6 and the transistor groups M10 and M11 in the first embodiment are not included. Thus, drain terminal voltages in transistors M1, M2, and M3 and the transistor groups M8 and M9 vary, and the relative variation among output currents from the transistors M1, M2, and M3 and the transistor groups M8 and M9 is large, so that the transconductance gm of the gm-adjusting circuit 84 is not precisely controlled as compared with the first embodiment. However, when the precision in controlling the transconductance gm satisfies that required by the primary RC filter 50, the third embodiment can be used. In addition, the number of the transistors can be reduced, so that the circuit size can be reduced.

The present invention is not limited to the above embodiments, and is applicable to other embodiments having different structures, functions, operations, and advantages. In the above embodiments, a gm-adjusting circuit according to the present invention is applied to a primary RC filter to achieve a stable transconductance in the primary RC filter. The gm-adjusting circuit according to the present invention can also be applied to apparatuses requiring a stable transconductance other than the primary RC filter, and can bring about the same effect.

What is claimed is:

1. A transconductance-adjusting circuit for adjusting the transconductance of an adjacent primary RC filter by adjusting a voltage bias supplied to the filter, said circuit comprising:
    a first VI converting circuit for converting a first reference voltage to a first current;
    a resistor for producing a first voltage corresponding to the first current output from the first VI converting circuit;
    a second VI converting circuit for outputting a second current corresponding to a potential difference between the first voltage produced by the resistor and a second reference voltage;
    an IV converting circuit for converting the second current output from the second VI converting circuit to a second voltage; and
    a feedback loop circuit portion for adjusting the first reference voltage of the first VI converting circuit in proportion to the second voltage output from the IV converting circuit so that said potential difference between the first voltage produced by the resistor and the second reference voltage is substantially 0; wherein
    the second voltage output from the IV converting circuit is provided as the voltage bias to the adjacent primary RC filter.

2. The transconductance-adjusting circuit according to claim 1, wherein the resistor is disposed at a location external to the rest of the transconductance-adjusting circuit.

3. The transconductance-adjusting circuit according to claim 1, wherein
    the first VI converting circuit includes an input circuit comprised of a differential pair composed of a pair of transistors;
    the first reference voltage is applied to input terminals of the pair of the transistors; and
    the second voltage output from the IV converting circuit is a bias voltage for the input terminals of the pair of the transistors.

4. The transconductance-adjusting circuit according to claim 1, further comprising a variable current source connected to an output of the first VI converting circuit, the resistor, and the second VI converting circuit.

5. The transconductance-adjusting circuit according to claim 1, wherein the filter is comprised of a first transistor group cascade-connected to a second transistor group, the first VI converting circuit is comprised of a third transistor group cascade-connected to a fourth transistor group, and the IV converting circuit is comprised of a first transistor cascade-connected to a second transistor.

6. The transconductance-adjusting circuit according to claim 1, wherein the filter is comprised of a first transistor group that is not cascade-connected to a second transistor group but rather is connected to a capacitor, the first VI converting circuit is comprised of a third transistor group that is not cascade-connected to a fourth transistor group but rather is connected to a current mirror circuit, and the IV converting circuit is comprised of only a first transistor.

* * * * *